US008885418B1

(12) United States Patent
Chung et al.

(10) Patent No.: US 8,885,418 B1
(45) Date of Patent: Nov. 11, 2014

(54) ADAPTIVE DOUBLE PULSE BCF PROGRAMMING

(71) Applicant: Sandisk Technologies Inc., Plano, TX (US)

(72) Inventors: Sung-Yong Chung, Davis, CA (US); Uday Chandrasekhar, San Jose, CA (US); Jianmin Huang, San Carlos, CA (US); Masaaki Higashitani, Cupertino, CA (US)

(73) Assignee: Sandisk Technologies, Inc., Plano, TX (US)

( * ) Notice: Subject to any disclaimer, the term of this patent is extended or adjusted under 35 U.S.C. 154(b) by 0 days.

(21) Appl. No.: 14/035,006

(22) Filed: Sep. 24, 2013

(51) Int. Cl.
*G11C 16/10* (2006.01)
*G11C 16/20* (2006.01)
*G11C 16/14* (2006.01)

(52) U.S. Cl.
CPC ............... *G11C 16/20* (2013.01); *G11C 16/14* (2013.01)
USPC ............ 365/185.28; 365/185.03; 365/185.17; 365/185.19

(58) Field of Classification Search
CPC ........................................................ G11C 16/10
USPC ..................................................... 365/185.28
See application file for complete search history.

(56) References Cited

U.S. PATENT DOCUMENTS

| 7,173,859 | B2 | 2/2007 | Hemink | |
| 7,580,290 | B2 | 8/2009 | Fong | |
| 8,254,177 | B2 | 8/2012 | Hemink | |
| 8,416,624 | B2 * | 4/2013 | Lei et al. | 365/185.19 |
| 8,498,138 | B2 * | 7/2013 | Abraham | 365/185.03 |

* cited by examiner

*Primary Examiner* — Son Mai
(74) *Attorney, Agent, or Firm* — Vierra Magen Marcus LLP

(57) ABSTRACT

Methods for preventing corruption of lower page data due to a write abort occurring during programming of upper page data by applying an adaptive double pulse programming scheme to non-volatile storage elements are described. In some embodiments, the programming of a first set of non-volatile storage elements to one or more lower-level programming states associated with upper page data (e.g., an A state) may be delayed until a second set of non-volatile storage elements intended to be programmed to one or more upper-level programming states associated with the upper page data (e.g., B or C states) reaches a trigger voltage. Once the trigger voltage has been reached or an appropriate programming delay has passed, then both the first set of non-volatile storage elements and the second set of non-volatile storage elements may be programmed during a common programming phase using double programming pulses.

20 Claims, 14 Drawing Sheets (Prior Art)

First programming pass

Second programming pass

ADAPTIVE DOUBLE PULSE BCF PROGRAMMING

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a data storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In recent years, NAND flash memory has been scaled in order to reduce cost per bit. However, as process geometries shrink, many design and process challenges are presented. These challenges include reduced charge storage capacity per memory cell and increased floating gate to floating gate coupling between adjacent memory cells.

DETAILED DESCRIPTION

Figure 1:
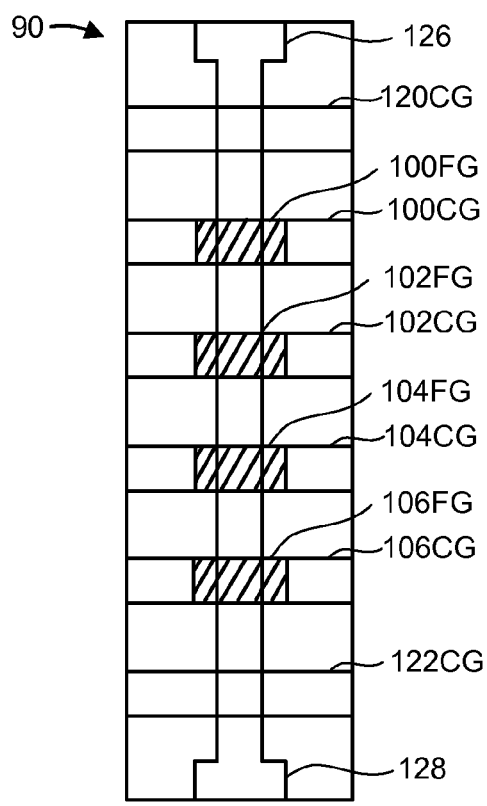
FIG. 1 depicts one embodiment of a NAND string.

Technology is described for preventing corruption of lower page data due to a write abort occurring during programming of upper page data by applying an adaptive double pulse programming scheme to non-volatile storage elements. In some embodiments, the programming of a first set of non-volatile storage elements to one or more lower-level programming states associated with upper page data (e.g., an A state) may be delayed until a second set of non-volatile storage elements intended to be programmed to one or more upper-level programming states associated with the upper page data (e.g., B or C states) reaches a trigger voltage (e.g., a triggering verify level). Each of the one or more upper-level programming states may be associated with threshold voltages that are greater than those associated with the one or more lower-level programming states. Once the trigger voltage has been reached or an appropriate programming delay has passed, then both the first set of non-volatile storage elements and the second set of non-volatile storage elements may be programmed together during a common programming phase (e.g., a program verify cycle) using double programming pulses.

In some embodiments, a first set of program and verify operations is applied to a first set of memory cells associated with one or more upper-level programming states (e.g., B and C states) and a second set of program and verify operations is applied to a second set of memory cells associated with one or more lower-level programming states (e.g., the A state). In some cases, a programming phase may include alternating cycles of applying one or more programming pulses followed by one or more verify pulses to determine whether non-volatile storage elements being programmed have reached their intended programming states. The first set of program and verify operations may be applied to the first set of memory cells prior to applying the second set of program and verify operations to the second set of memory cells. The programming of the second set of memory cells may be delayed until a triggering event is detected. In one embodiment, the triggering event may involve detecting that a number of the first set of memory cells has reached or been programmed to a certain triggering verify level (e.g., that 90% of the first set of memory cells have reached a verify level of at least 2V). The triggering verify level may be less than the B-state verify level or less than the verify level for the lowest upper-level programming state. In another embodiment, the triggering event may involve detecting that a particular number of programming phases (or cycles) have been applied to memory cells intended to be programmed to upper-level programming states.

Once the triggering event is detected then both the first set of memory cells and the second set of memory cells may be programmed by applying double programming pulses such that a first set of pulses is applied to the first set of memory cells and a second set of pulses is applied to the second set of memory cells during a common programming phase. Programming the first set of memory cells and the second set of memory cells during a common programming phase may reduce threshold voltage distribution widening caused by floating gate to floating gate coupling from memory cells being programmed to the one or more lower-level programming states to memory cells being programmed to the one or more upper-level programming states. In some case, the start voltages and programming step sizes for the first set of pulses (e.g., BC-state pulses) and the second set of pulses (e.g., A-state pulses) may be independently set and adjusted.

One issue with programing multi-level memory cells (or other non-volatile storage elements) is that during programming of upper page data, a write abort occurring before a memory cell has reached an intended upper-level programming state associated with the upper page data may cause corruption of previously programmed lower page data if it is not possible to distinguish between a lower-level programming state (e.g., an A state) associated with the upper page data and the LM (lower-middle) state associated with lower page data. The write abort may be caused by a power connection being unexpectedly disconnected or removed from a portable electronic device or due to a battery not being able to provide a sufficient voltage or power to the portable electronic device. The lower page data may correspond with data that was previously written (e.g., a song that was downloaded ten minutes prior to the write abort). Thus, there is a need to protect against data corruption caused by write aborts.

Some approaches to preventing corruption of lower page data during an upper page write abort include LMB programming and BCF programming. During LMB programming, non-volatile storage elements programmed to the LM state are shifted to a higher LMB programming state prior to performing upper page programming. Shifting non-voltage storage elements from the LM state up to a higher LMB state may prevent the overlap of the A state (which may be formed during upper page programming) with the LMB state, thereby preventing lower page data from being corrupted by an upper page write abort. However, as the LMB distribution may widen during A-state programming due to floating gate to floating gate coupling, the programming step size may need to be reduced in order to prevent the upper tail of the LMB programming state from overlapping with the lower tail of the C-state, thereby increasing the programming time.

During BCF programming (or BC first programming), non-volatile storage elements to be programmed to B and C states are completely programmed to the B and C states prior to programming other non-volatile storage elements to the A state. In this case, if a write abort occurs during the programming of the non-volatile storage elements to the B and C states, then lower page data is not corrupted since the A state has not been formed yet (i.e., none of the other non-volatile storage elements have been shifted from the erase state to the A state). If a write abort occurs during A-state programming of the upper page, then the lower page is still recoverable since the B and C states have already been formed and thus there cannot be an overlap of the A and B states. However, as the B and C states are completely programmed first, floating gate to floating gate coupling during the A-state programming phase may widen the threshold voltage distributions for both the B and C states, thereby increasing the number of bit failures.

Figure 2:
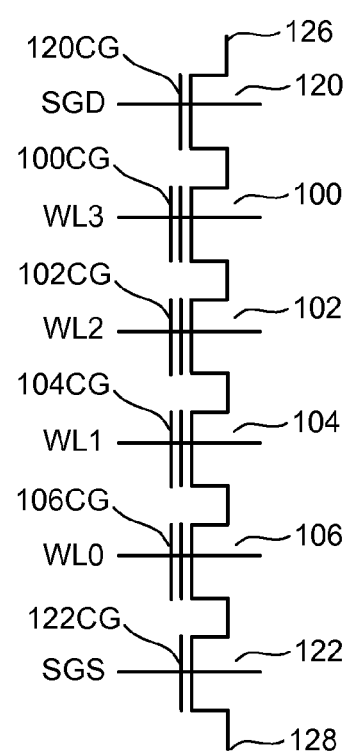
FIG. 2 depicts an equivalent circuit diagram for the NAND string of FIG. 1.

FIG. 1 depicts one embodiment of a NAND string 90. FIG. 2 depicts an equivalent circuit diagram for the NAND string of FIG. 1. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string to a bit line 126. Select gate 122 connects the NAND string to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string can have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data. Moreover, although NAND technology using floating-gate transistors is described herein, the technology described herein may also be used with other memory technologies including those that employ charge trapping, phase-change (e.g., chalcogenide materials), or state-change materials.

A typical architecture for a flash memory system using a NAND flash memory structure will include a plurality of NAND strings within a memory block. A memory block may comprise a unit of erase. In some cases, the NAND strings within a memory block may share a common well (e.g., a P-well). Each NAND string is connected to a common source line by its source select gate controlled by select line SGS and connected to its associated bit line by its drain select gate controlled by select line SGD. The use of the terms connect, connected, and connection in this document can include a direct connection or an indirect connection. Typically, each bit line runs on top of its associated NAND string in a direction perpendicular to the word lines and is connected to a sense amplifier. Relevant examples of NAND type flash memories and their operation are provided in the following U.S. Patents/Patent Applications, all of which are herein incorporated by reference: U.S. Pat. No. 5,570,315; U.S. Pat.

No. 5,774,397; U.S. Pat. No. 6,046,935; U.S. Pat. No. 6,456,528; and U.S. Pat. Publication No. US2003/0002348. Other types of non-volatile storage devices, in addition to NAND flash memory, can also be used.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation. Generally, it is important for an appropriate amount of boosting to be used. If the boosting is too low, an inhibited storage element may experience program disturb, in which its threshold voltage is raised to a next higher data state, or to a level at which the storage element cannot be accurately read. On the other hand, if boosting is too high, electromagnetic coupling effects can raise the threshold voltages of the selected storage elements excessively, resulting in undesirable widening of the threshold voltage distributions.

Figure 3:
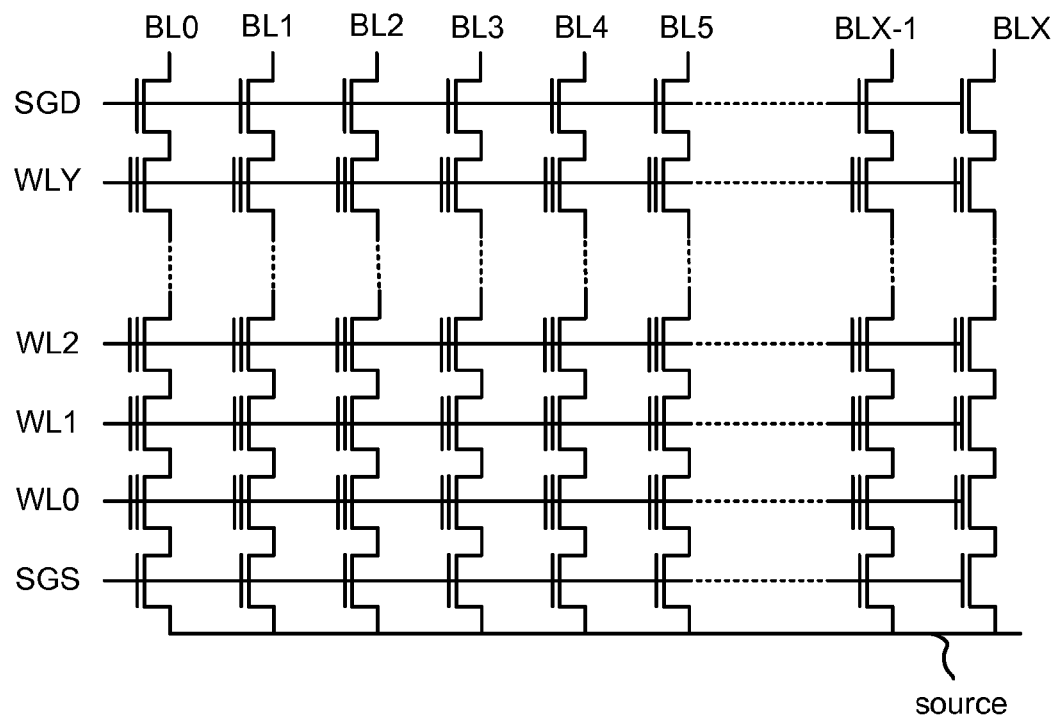
FIG. 3 depicts one embodiment of a memory block including a plurality of NAND strings.

FIG. 3 depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain side select gate controlled by the drain side selection signal SGD. Each NAND string is connected to a source line (source) via a source side select gate controlled by source side selection signal SGS.

In order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain side selection signals SGD1 and SGD2. Each NAND string of the pair would then have two drain side select gates, each connected to a different drain side selection signal of the two drain side selection signals SGD1 and SGD2. One of the two drain side select gates for each NAND string may be a depletion mode transistor with its threshold voltage lower than 0 volts. One potential problem with using two select gates on the drain side of each NAND string is that two drain side select gates (as compared to one drain side select transistor) requires more area on the die. Therefore, from an integrated circuit area standpoint, it may be beneficial to only use one drain side selection gate for each NAND string and then connect each NAND string of the pair with only one of the two drain side selection signals.

Figure 4A:
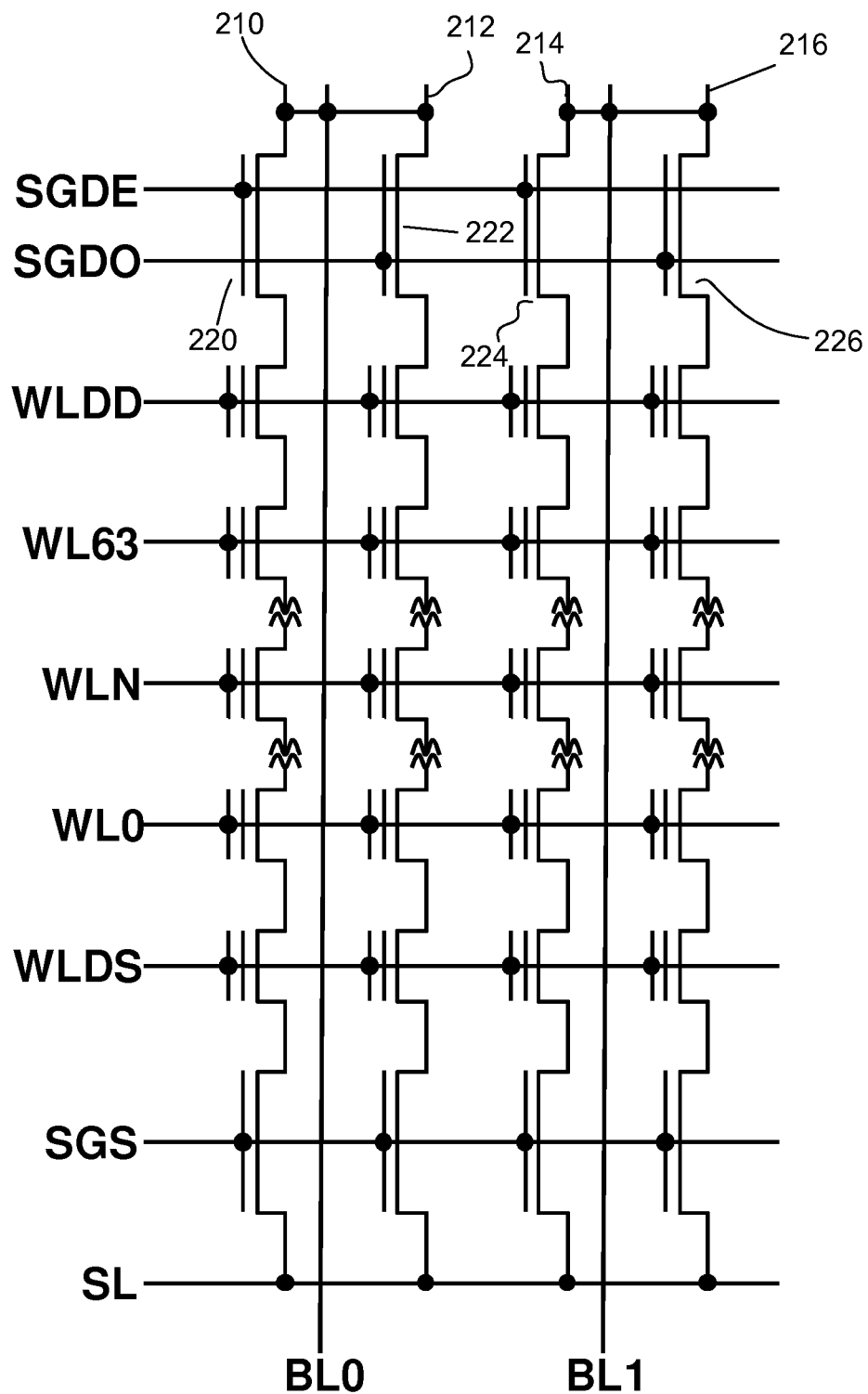
FIG. 4A depicts one embodiment of a non-volatile storage system in which a bit line is shared between two adjacent NAND strings within a memory block.

FIG. 4A depicts one embodiment of a non-volatile storage system in which a bit line is shared between two adjacent NAND strings within a memory block. As depicted, the non-volatile storage system includes four NAND strings (i.e., two pairs of NAND strings corresponding with bit lines BL0 and BL1). Each NAND string includes 64 memory cells corresponding with word lines WL0-WL63. There are two dummy memory cells corresponding with word lines WLDS and WLDD, one on each side of the 64 memory cells. In other embodiments, more than or less than 64 memory cells may be included within a NAND string. The non-volatile storage system includes two drain side selection signals SGDE and SGDO and two bit lines BL0 and BL1. Bit line BL0 is connected to NAND string 210 and NAND string 212. Bit line BL1 is connected to NAND string 214 and NAND string 216.

The drain side selection signal SGDE is used to select or unselect NAND string 210 and NAND string 214. The drain side signal SGDO is used to select or unselect NAND string 212 and NAND string 216. Each NAND string only includes one drain side selection gate, implemented as a single transistor. For example, NAND string 210 includes drain side selection gate 220, NAND string 212 includes drain side selection gate 222, NAND string 214 includes drain side selection gate 224, and NAND string 216 includes drain side selection gate 226. Drain side selection signal line SGDE is in communication with selection gate 210 and selection gate 214. Drain side selection signal SGDO is in communication with selection gate 222 and selection gate 226. Each NAND string is in communication with a source line SL via a source select gate controlled by source side selection signal SGS.

Figure 4B:
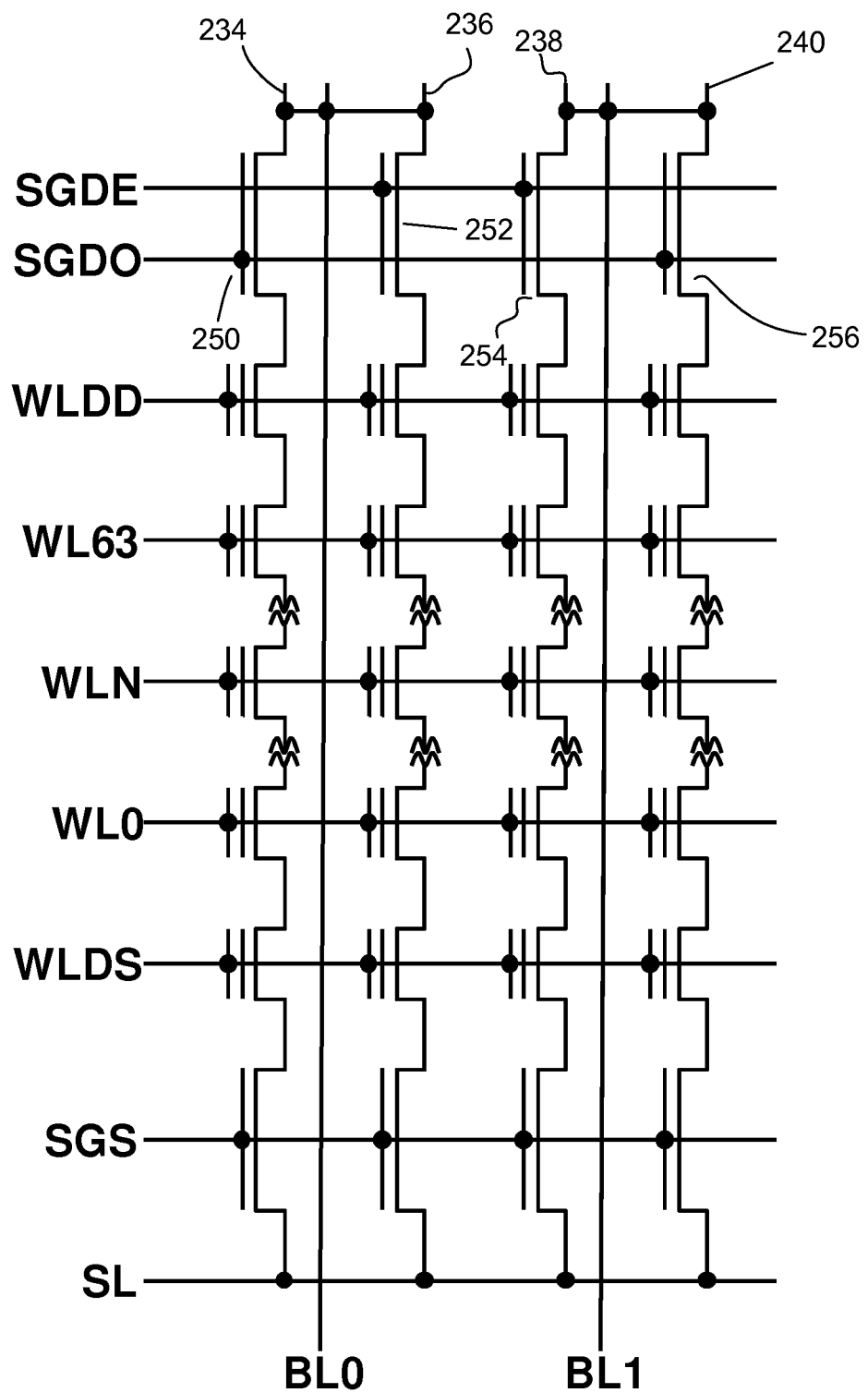
FIG. 4B provides an alternative embodiment of a non-volatile storage system in which a bit line is shared between two adjacent NAND strings.

FIG. 4B provides an alternative embodiment of a non-volatile storage system in which a bit line is shared between two adjacent NAND strings. As depicted, the non-volatile storage system includes four NAND strings (i.e., two pairs of NAND strings corresponding with bit lines BL0 and BL1). The non-volatile storage system includes two drain side selection signals SGDE and SGDO and two bit lines BL0 and BL1. Bit line BL0 is connected to and shared by NAND string 234 and NAND string 236. Bit line BL1 is connected to and shared by NAND string 238 and NAND string 240. The drain side selection signal SGDE is in communication with selection gate 252 and selection gate 254. The drain side selection signal SGDO is in communication with selection gate 250 and selection gate 256. Each NAND string is in communication with a source line SL via a source select gate controlled by source side selection signal SGS. A difference between the embodiments of FIG. 4A and FIG. 4B is that the embodiment of FIG. 4A alternates the connections of the drain side select signals such that every other NAND string has its drain side selection gate in communication with the same drain side selection signal while the embodiment of FIG. 4B has adjacent pairs of NAND strings in communication with the same drain side selection signal.

One benefit of the shared-bit-line NAND architectures depicted in FIGS. 4A-4B is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

Figure 5:
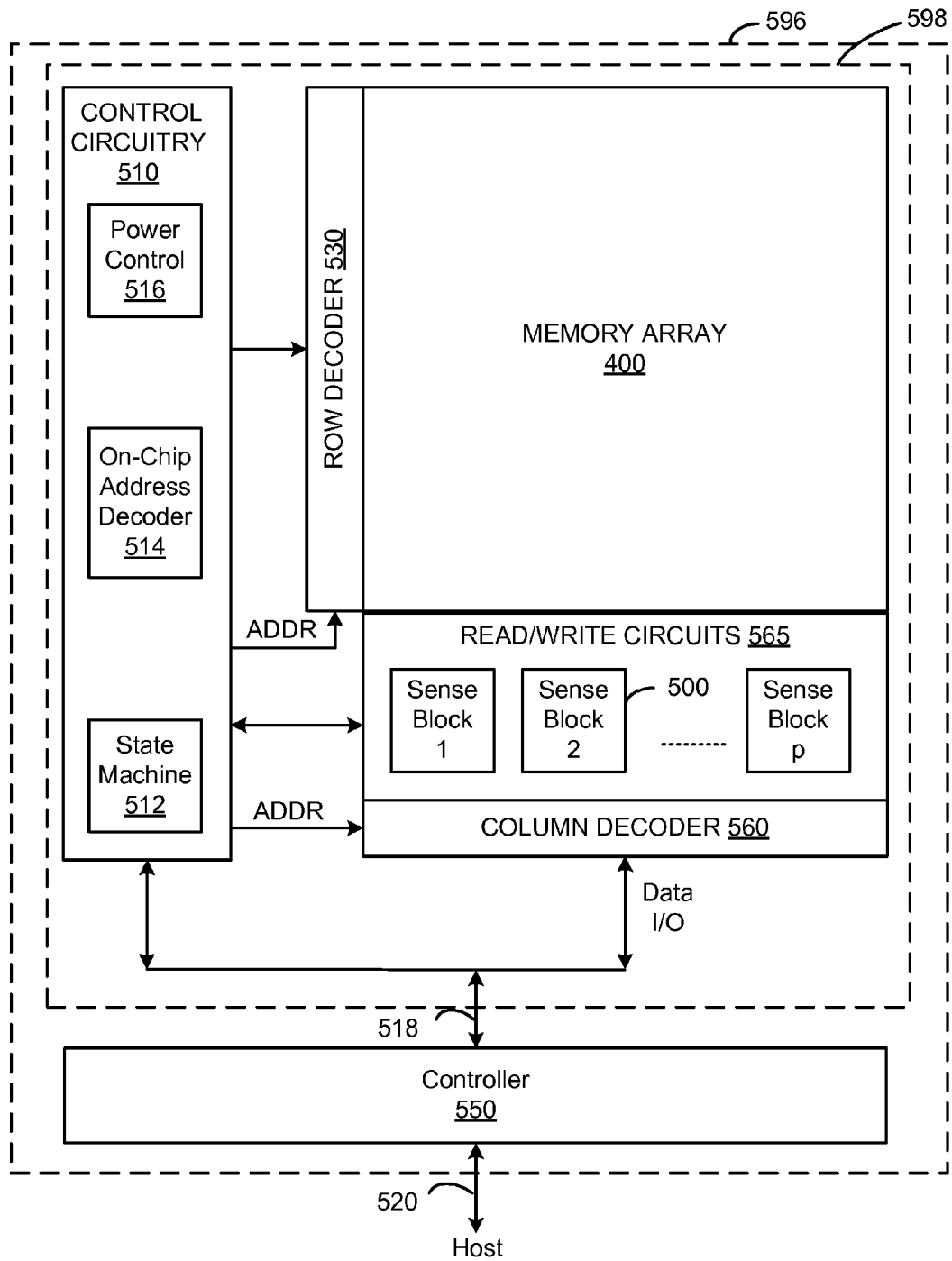
FIG. 5 depicts one embodiment of a non-volatile storage system including read/write circuits for reading and programming a page (or other unit) of memory cells.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a two-dimensional or three-dimensional array of storage elements), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half.

The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
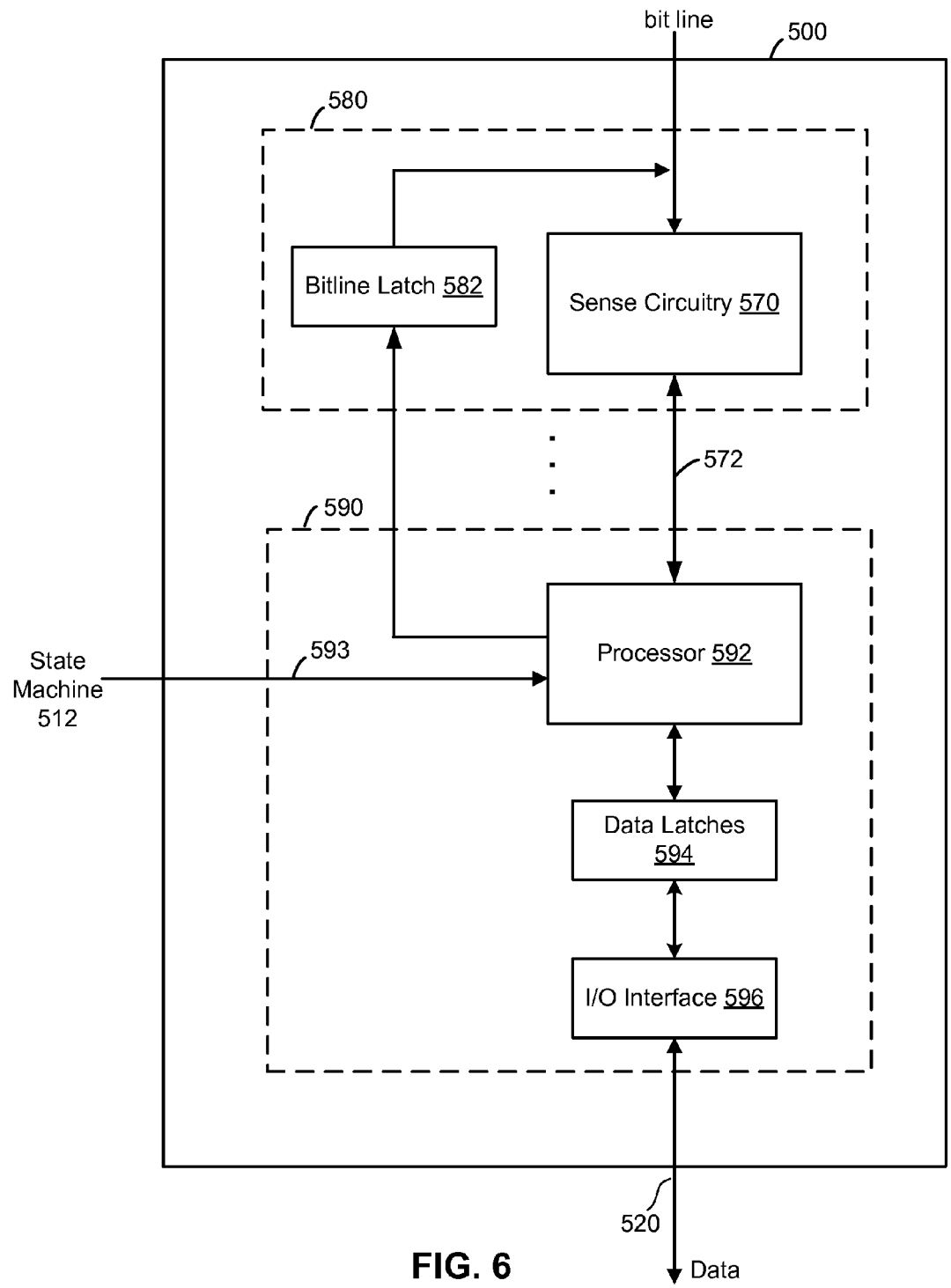
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 5. I/O interface 596 provides an interface between data latches 594 and the data bus 520.

During a read operation or other storage element sensing operation, a state machine, such as state machine 512 of FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
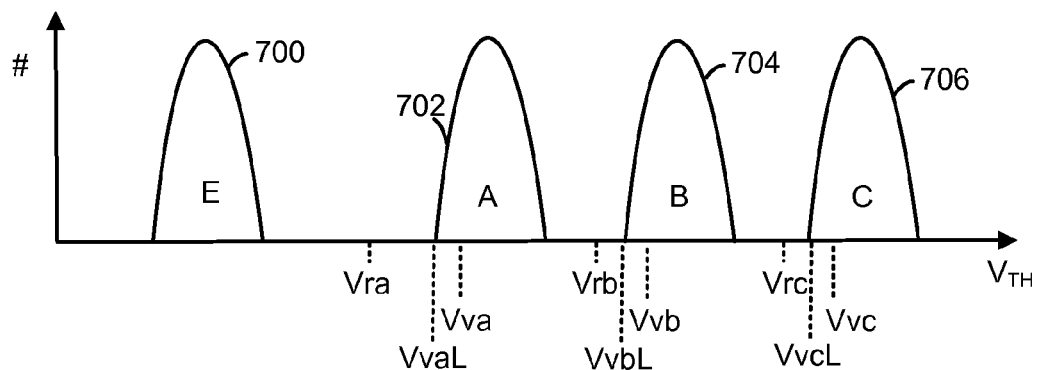
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8:
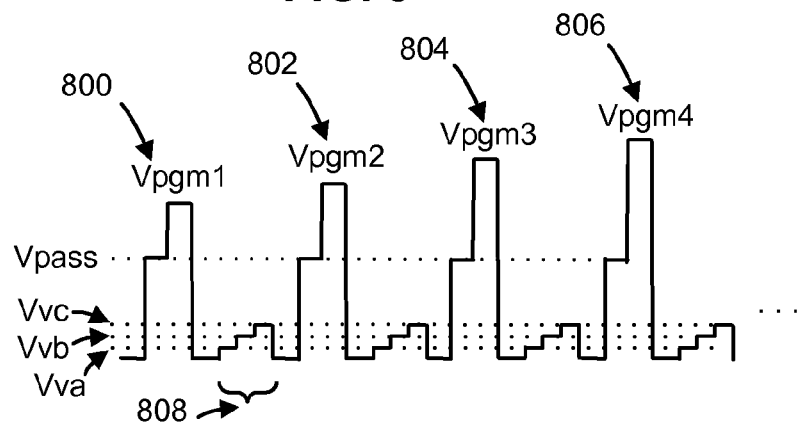
FIG. 8 depicts one embodiment of a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 8, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
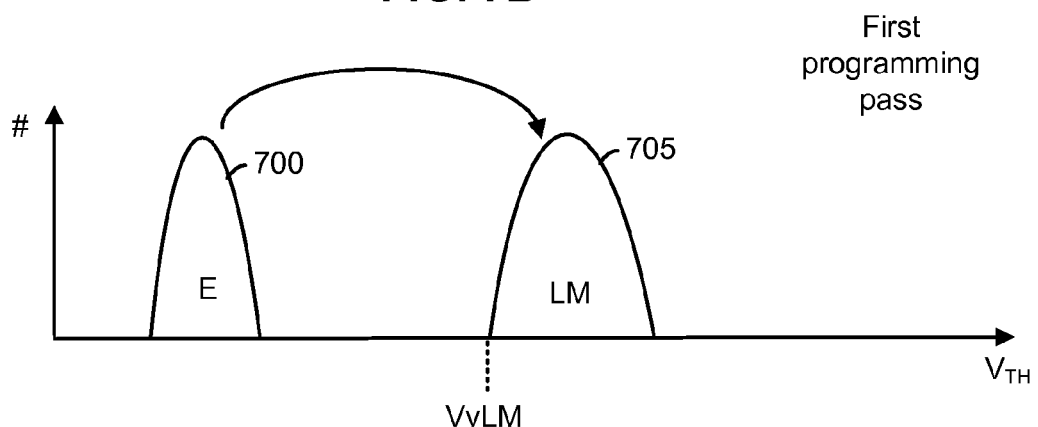
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states may be depicted by repeating the threshold voltage distributions 700, 702, 704 and 706 from FIG. 7A. These states, and the bits they represent, may comprise: E-state (11), A-state (01), B-state (00) and C-state (10). For E-state, both pages (i.e., the upper page and the lower page) store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

Figure 9A:
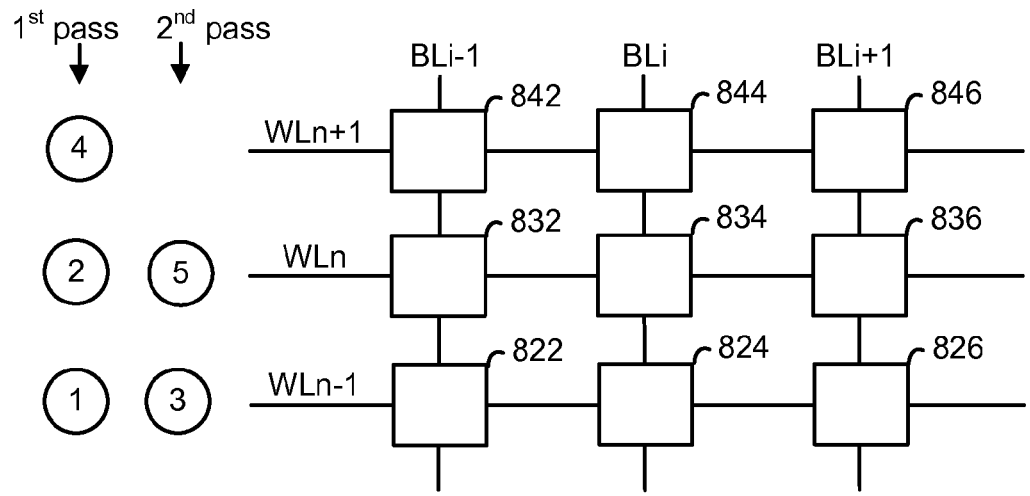
FIG. 9A depicts one embodiment of a multi-pass program operation for a set of storage elements.

In one embodiment, after a storage element is programmed from the E-state to the LM-state, as indicated by step "1" in FIG. 9A, its neighbor storage element on an adjacent word line WLn in the NAND string will then be programmed with respect to its lower page in a respective first programming pass of the adjacent word line, as indicated by step "2" in FIG. 9A.

Figure 7C:
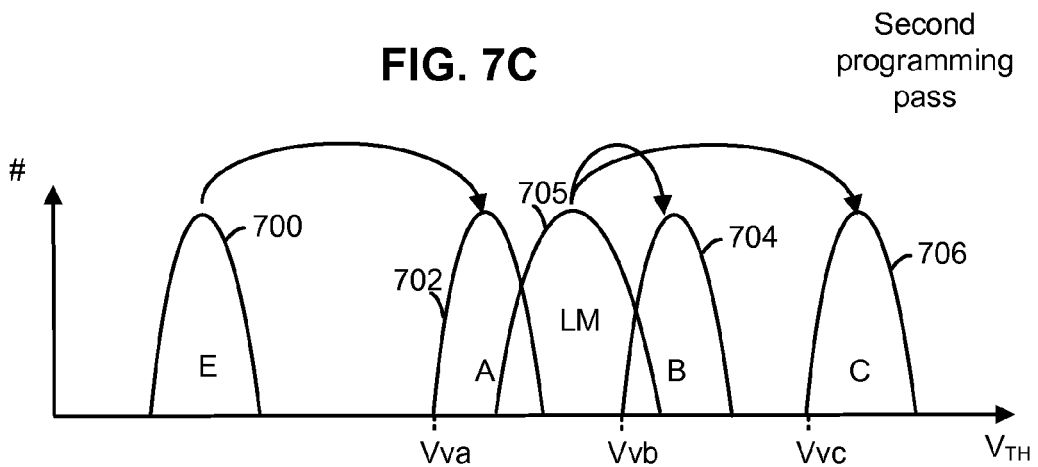
FIG. 7C depicts one embodiment of a second pass of the two-pass programming technique.

FIG. 7C depicts one embodiment of a second pass of the two-pass programming technique. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 9A. As indicated by step "3" in FIG. 9A, storage elements associated with word line WLn+1 may be programmed with respect to its lower page in a first programming pass. The second pass of the two-pass programming technique for WLn is indicated by step "5" in FIG. 9A.

Figure 7D:
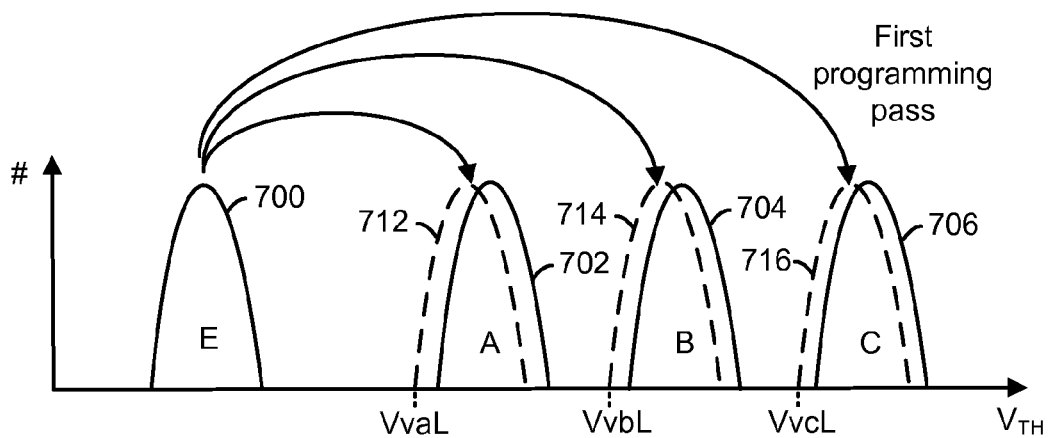
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
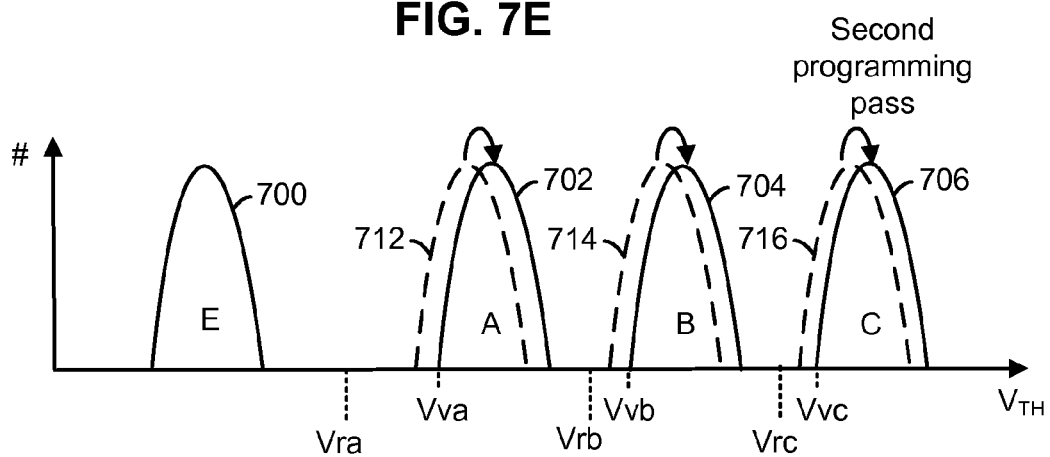
FIG. 7E depicts one embodiment of a second pass of the two-pass programming technique referred to in FIG. 7D.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data (i.e., lower page data and upper page data), the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques can be used in which the Vth of a storage element may be lowered gradually as it is programmed to a target data state. Programming techniques which measure storage element current can be used as well. The concepts described herein may be adapted to the different programming techniques.

FIG. 8 depicts one embodiment of a series of program and verify pulses which are applied to a selected word line during a programming operation. A programming operation may include multiple program-verify iterations, where each iteration applies one or more programming voltages followed by one or more verify voltages, to a selected word line. In one embodiment, the programming voltages are stepped up in successive iterations. Moreover, each programming voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively, and so forth. One or more verify voltages 808, such as verify voltages Vva, Vvb and Vvc, may be provided after each program pulse (or set of programming pulses). In some cases, one or more initial programming pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

FIG. 9A depicts one embodiment of a multi-pass program operation for a set of storage elements. As depicted, the storage elements 822, 832, 842, 824, 844, 826, 836, and 846 comprise the eight adjacent (or neighboring) storage elements of storage element 834. The components depicted may be a subset of a much larger set of storage elements, word lines and bit lines. In one possible program operation, storage elements on word line WLn−1, e.g., storage elements 822, 824 and 826, are programmed in a first programming pass. This step is represented by the circled "1." Next ("2"), storage elements on word line WLn, e.g., storage elements 832, 834 and 836, are programmed in a first programming pass. In this example, when a word line is selected for programming, verify operations occur after each program pulse. During the verify operations on word line WLn, one or more verify voltages are applied to word line WLn and pass voltages are applied to the remaining word lines including word line WLn−1 and word line WLn+1. The pass voltages are used to turn on (i.e., make conductive) the unselected storage elements so that a sensing operation can occur for the selected word line. Next ("3"), storage elements on word line WLn−1 are programmed in a second programming pass (e.g., based on upper page data). Next ("4"), storage elements on word line WLn+1, e.g., storage elements 842, 844 and 846, are programmed in a first programming pass (e.g., based on lower page data). Next ("5"), the storage elements on word line WLn are programmed in a second programming pass to their respective target states.

Figure 9B:
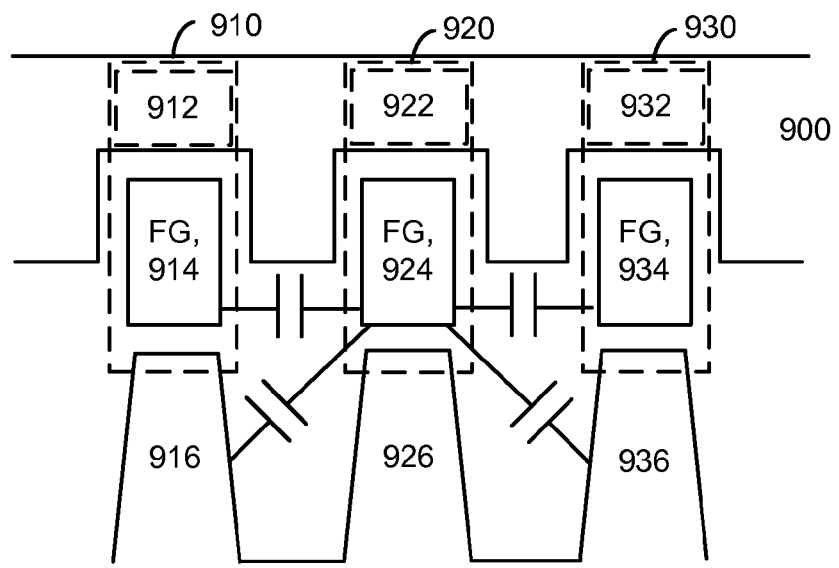
FIG. 9B depicts one embodiment of a cross-sectional view of NAND strings showing channel-to-floating gate coupling and floating gate-to-floating gate coupling.

FIG. 9B depicts one embodiment of a cross-sectional view of NAND strings showing channel-to-floating gate coupling and floating gate-to-floating gate coupling. A bit line or NAND string direction goes into the page, and a word line direction goes horizontal from left to right. A word line 900 extends across multiple NAND strings. A first NAND string includes a channel region 916. A storage element 910 in the first NAND string includes a control gate 912, which is a portion of the word line 900, and a floating gate 914. A second NAND string includes a channel region 926. A storage element 920 in the second NAND string includes a control gate 922, which is a portion of the word line 900, and a floating gate 924. A third NAND string includes a channel region 936. A storage element 930 in the third NAND string includes a control gate 932, which is a portion of the word line 900, and a floating gate 934. As depicted, storage elements 910 and 930 share the same word line with and are adjacent to storage element 920.

Figure 10:
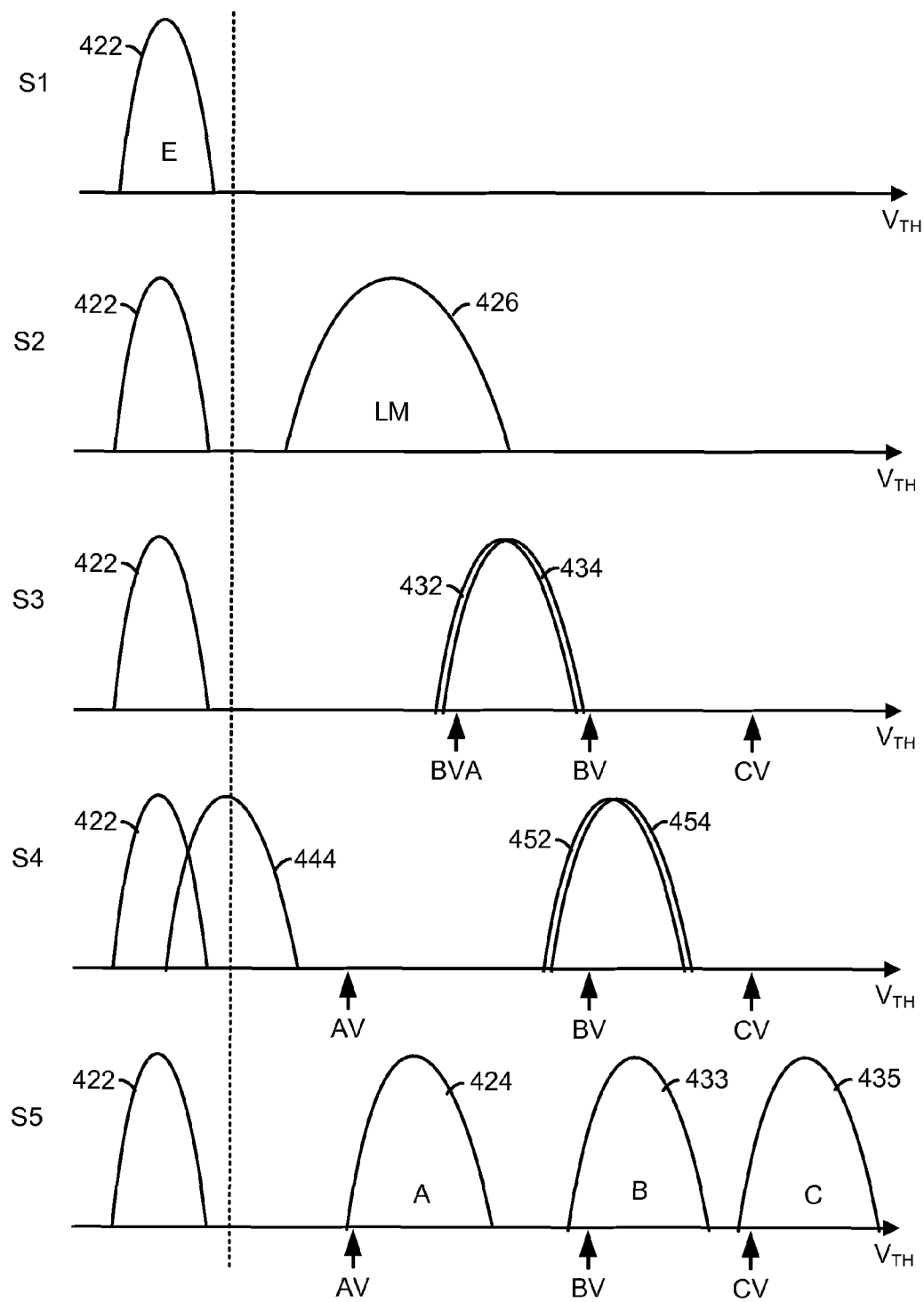
FIG. 10 depicts one embodiment of threshold voltage distributions associated with a sequence of programming steps for programming non-volatile storage elements.

FIG. 10 depicts one embodiment of threshold voltage distributions associated with a sequence of programming steps for programming non-volatile storage elements. As depicted, after programming step S1 is completed, a plurality of non-volatile storage elements is set into an erase state 422. After programming step S2 is completed, a first subset of the plurality of non-volatile storage elements has been programmed to the LM (lower-middle) state 426, while a second subset of the plurality of non-volatile storage elements remains in the erase state 422. After programming step S2 is completed based on lower page data, programming of the first subset of the plurality of non-volatile storage elements to upper-level programming states (i.e., the B and C states) based on upper page data is initiated. As depicted, after programming step S3 is completed, the first subset of the plurality of non-volatile storage elements has been programmed to intermediate distributions 432 and 434 greater than the LM state 426 but less than upper-level programming states 433 and 435. After a particular number of the first subset of the plurality of non-volatile storage elements has reached a trigger voltage BVA (e.g., equivalent to 90% or 95% of the first subset of the plurality of non-volatile storage elements exceeding the trigger voltage BVA), then programming of the second subset of the plurality of non-volatile storage elements may be initiated. The trigger voltage BVA may be greater than the verify level AV used for verifying the lower-level programming state 424.

In one embodiment, once the intermediate distributions 432 and 434 have shifted such that 5% or 10% of the first subset of the plurality of non-volatile storage elements are less than the trigger voltage BVA, then programming of the second subset of the plurality of non-volatile storage elements may be initiated. In another embodiment, after a particular number of the first subset of the plurality of non-volatile storage elements have reached or exceeded the trigger voltage BVA, then both the first set of non-volatile storage elements and the second set of non-volatile storage elements may be programmed during a common programming and verification phase in which verify level AV may be used to determine whether the lower-level programming state 424 has been reached and verify levels BV and CV may be used to determine whether the upper-level programming states 433 and 435 have been reached.

After programming step S4 has completed, a portion of the second subset of the plurality of non-volatile storage elements has been programmed to intermediate distribution 444 greater than the erase state 422 but less than the lower-level programming state 424 (i.e., the A-state) and a portion of the second subset of the plurality of non-volatile storage elements remains in the erase state 422. The first subset of the plurality of non-volatile storage elements has been programmed to intermediate distributions 452 and 454 greater than the intermediate distributions 432 and 434 but less than upper-level programming states 433 and 435. After programming step S5 has completed, a portion of the second subset of the plurality of non-volatile storage elements completes programming to lower-level programming state 424 based on upper page data and the first subset of the plurality of non-volatile storage elements completes programming to upper-level programming states 433 and 435 based on the upper page data.

In some embodiments, the particular number of the first subset of the plurality of non-volatile storage elements that causes a triggering event for beginning programming of the second subset of the plurality of non-volatile storage elements may be determined based on a non-volatile memory's capability to correct bit errors (e.g., an ECC capability). In some cases, the particular number of the first subset of the plurality of non-volatile storage elements that causes the triggering event may be adjusted over time based on an aging of the non-volatile storage elements or a number of times that the non-volatile storage elements have been erased. The start voltages (or initial programming voltages) and programming step sizes applied to the first subset of the plurality of non-volatile storage elements and the second subset of the plurality of non-volatile storage elements may be independently set and adjusted over time. The initial programming voltages and programming step sizes may comprise programming parameters. In one example, the programming step size for programming pulses applied to non-volatile storage elements intended to be programmed to an A-state may be set to 50 mV and the programming step size for programming pulses applied to non-volatile storage elements intended to be programmed to the B and C states may be set to 100 mV.

Figure 11A:
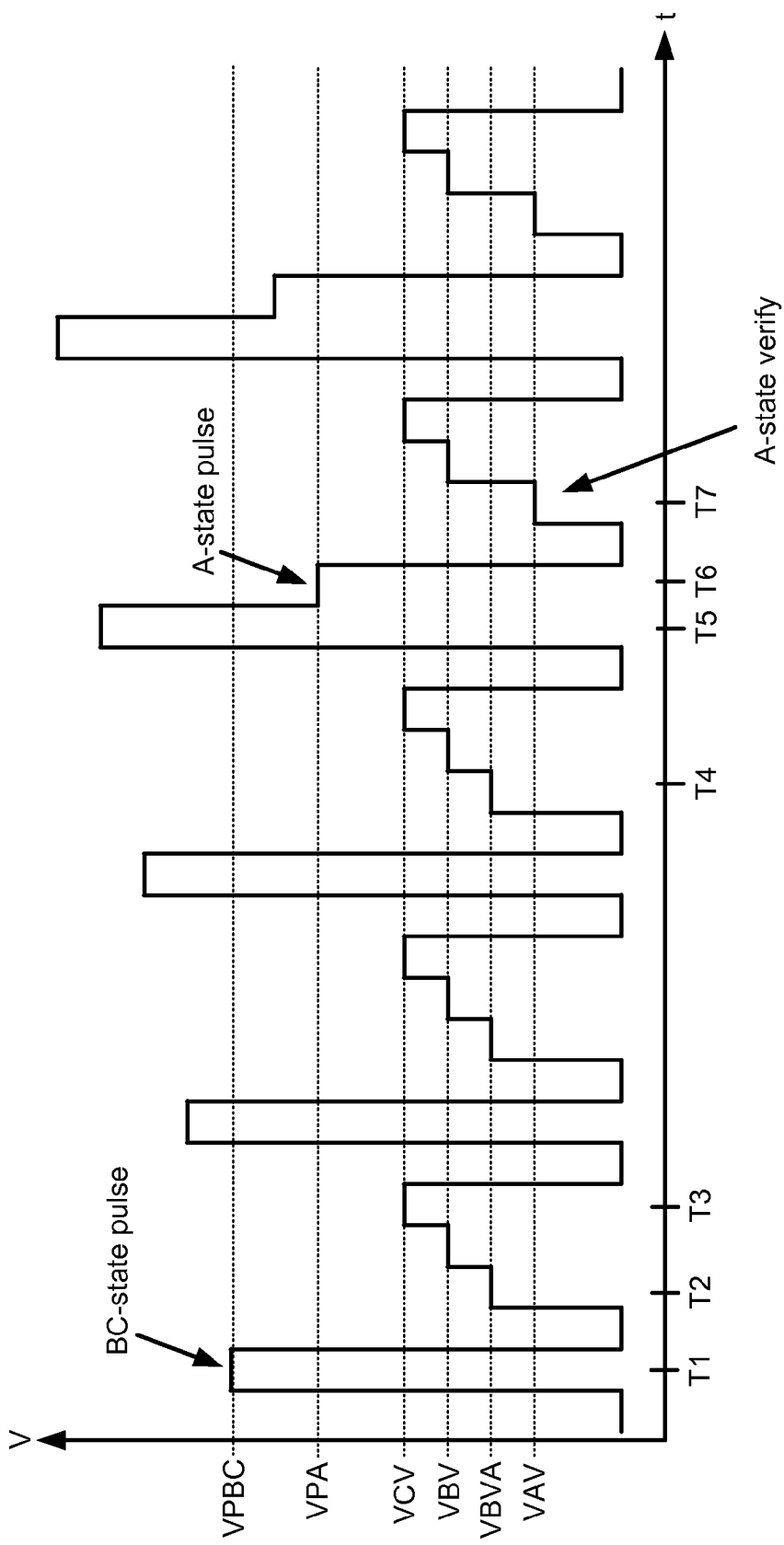
FIG. 11A depicts one embodiment of a plurality of program and verify pulses for programming non-volatile storage elements connected to a selected word line.

FIG. 11A depicts one embodiment of a plurality of program and verify pulses for programming non-volatile storage elements connected to a selected word line. As depicted, at time T1, a programming pulse of magnitude VPBC is provided for programming non-volatile storage elements to one or more upper-level programming states (e.g., B and C states). Although a single programming pulse is depicted, in some cases, two or more programming pulses may be issued. The magnitude of the programming pulse may be increased over time (e.g., according to a step size parameter). Between times T2 and T3, three verify pulses are provided. A first verify pulse of magnitude VBVA (e.g., for determining whether a triggering verify level has been satisfied) followed by a second verify pulse of magnitude VBV (e.g., the verify level for the B-state) followed by a third verify pulse of magnitude VCV (e.g., the verify level for the C-state). In some cases, between times T3 and T4, one or more programming phases including alternating cycles of applying one or more programming pulses for programming non-volatile storage elements to one or more upper-level programming states followed by one or more verify pulses may be provided. At time T4, while providing a verify pulse of magnitude VBVA, a triggering event may be detected in which a particular number of the non-volatile storage elements being programmed to the one or more upper-level programming states have reached or exceeded the trigger verify level of VBVA (e.g., that 90% or 95% of the non-volatile storage elements have reached the trigger verify level).

Once the triggering event has been detected, then both non-volatile storage elements being programmed to the one or more upper-level programming states (e.g., B and C states) and other non-volatile storage elements being programmed to one or more lower-level programming states (e.g., the A state) may be programmed together during a common programming phase using double programming pulses. At time T5, a programming pulse for programming the non-volatile storage elements being programmed to the one or more upper-level programming states is used. At time T6, a programming pulse of magnitude VPA is issued for programming the other non-volatile storage elements being programmed to one or more lower-level programming states. At time T7, a verify pulse of magnitude VAV (e.g., the verify level for the A-state) is issued. The voltage level associated with the VAV verify pulse may be less than the voltage level associated with the VBVA verify pulse. After dual programming has been initiated, three verify levels corresponding with the verify levels for the A-state, B-state, and C-state may be used during the verification portion of the common programming phase.

In some embodiments, the verify pulse used for determining whether a triggering event has occurred may be delays a predetermined number of programming cycles (e.g., the verify pulse associated with VBVA may be delayed until after three programming cycles have passed). The predetermined number of programming cycles may be adjusted (e.g., increased) over time based on a program/erase cycle count associated with a memory block or based on the number of times that the non-volatile storage elements have been programmed and erased. In some cases, the triggering event may occur when all of the non-volatile storage elements being programmed to the one or more upper-level programming states pass the triggering verify level. In some embodiments, the triggering event may occur at the earliest point in time of either the detection of a particular number of the non-volatile storage elements being programmed to the one or more upper-level programming states reaching or exceeding the trigger verify level or after a predetermined number of programming cycles have occurred.

Figure 11B:
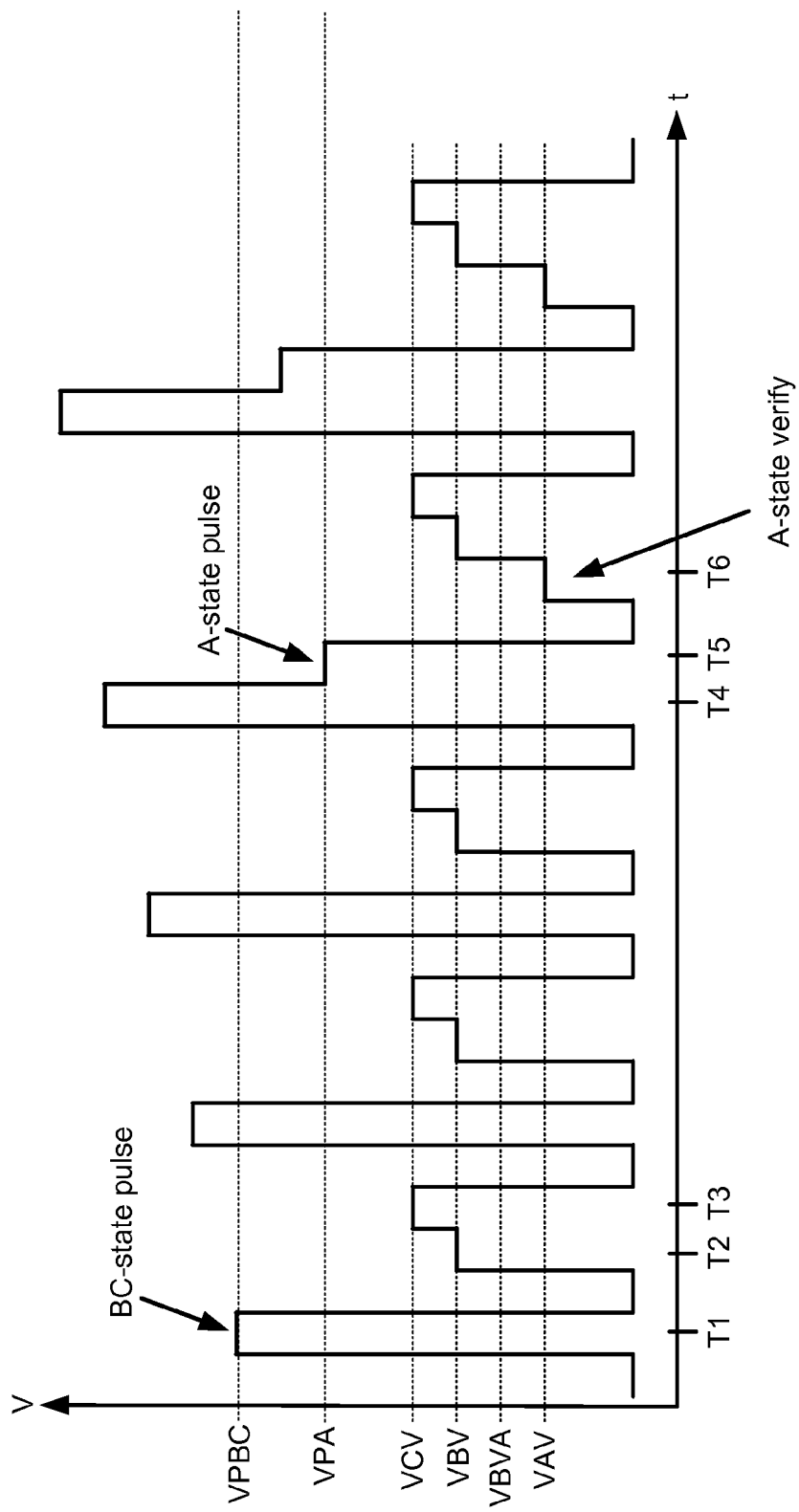
FIG. 11B depicts an alternative embodiment of a plurality of program and verify pulses for programming non-volatile storage elements connected to a selected word line.

FIG. 11B depicts an alternative embodiment of a plurality of program and verify pulses for programming non-volatile storage elements connected to a selected word line. As depicted, at time T1, a programming pulse of magnitude VPBC is provided for programming non-volatile storage elements to one or more upper-level programming states (e.g., B and C states). Although a single programming pulse is depicted, in some cases, two or more programming pulses may be issued. The magnitude of the programming pulse may be increased over time (e.g., according to a step size parameter). Between times T2 and T3, two verify pulses are provided. A first verify pulse of magnitude VBV (e.g., the verify level for the B-state) followed by a second verify pulse of magnitude VCV (e.g., the verify level for the C-state). In some cases, between times T3 and T4, one or more programming phases including alternating cycles of applying one or more programming pulses for programming non-volatile storage elements to one or more upper-level programming states followed by one or more verify pulses may be provided. Prior to time T4, a triggering event may be detected if a particular number of programming phases (or cycles) have been applied to the non-volatile storage elements being programmed to the one or more upper-level programming states or if a particular programming delay period of time has passed since programming of the non-volatile storage elements was initiated (e.g., 650 ns after time T1).

Once the triggering event has been detected, then both non-volatile storage elements being programmed to the one or more upper-level programming states (e.g., B and C states) and other non-volatile storage elements being programmed to one or more lower-level programming states (e.g., the A state) may be programmed together during a common programming phase using double programming pulses. At time T4, a programming pulse for programming the non-volatile storage elements being programmed to the one or more upper-level programming states is used. At time T5, a programming pulse of magnitude VPA is issued for programming the other non-volatile storage elements being programmed to one or more lower-level programming states. At time T6, a verify pulse of magnitude VAV (e.g., the verify level for the A-state) is issued. After dual programming pulses have been initiated, three verify levels corresponding with the verify levels for the A-state, B-state, and C-state may be used during the verification portion of the common programming phase.

In some embodiments, the particular number of programming phases (or cycles) or the particular programming delay corresponding with the triggering event may be adjusted (e.g., increased) over time based on a program/erase cycle count associated with a memory block or based on the number of times that non-volatile storage elements have been programmed and erased. In one example, the particular number of programming phases may comprise five programming phases and then after 20 program/erase cycles, the particular number of programming phases may be increased to seven programming phases.

In some embodiments, the triggering verify level used for detecting a triggering event may be dynamically adjusted over time based on a number of times that the non-volatile storage elements have been programmed and erased. In one example, the triggering verify level may comprise four volts and then after 20 program/erase cycles, the triggering verify level may be increased to five volts.

Figure 12A:
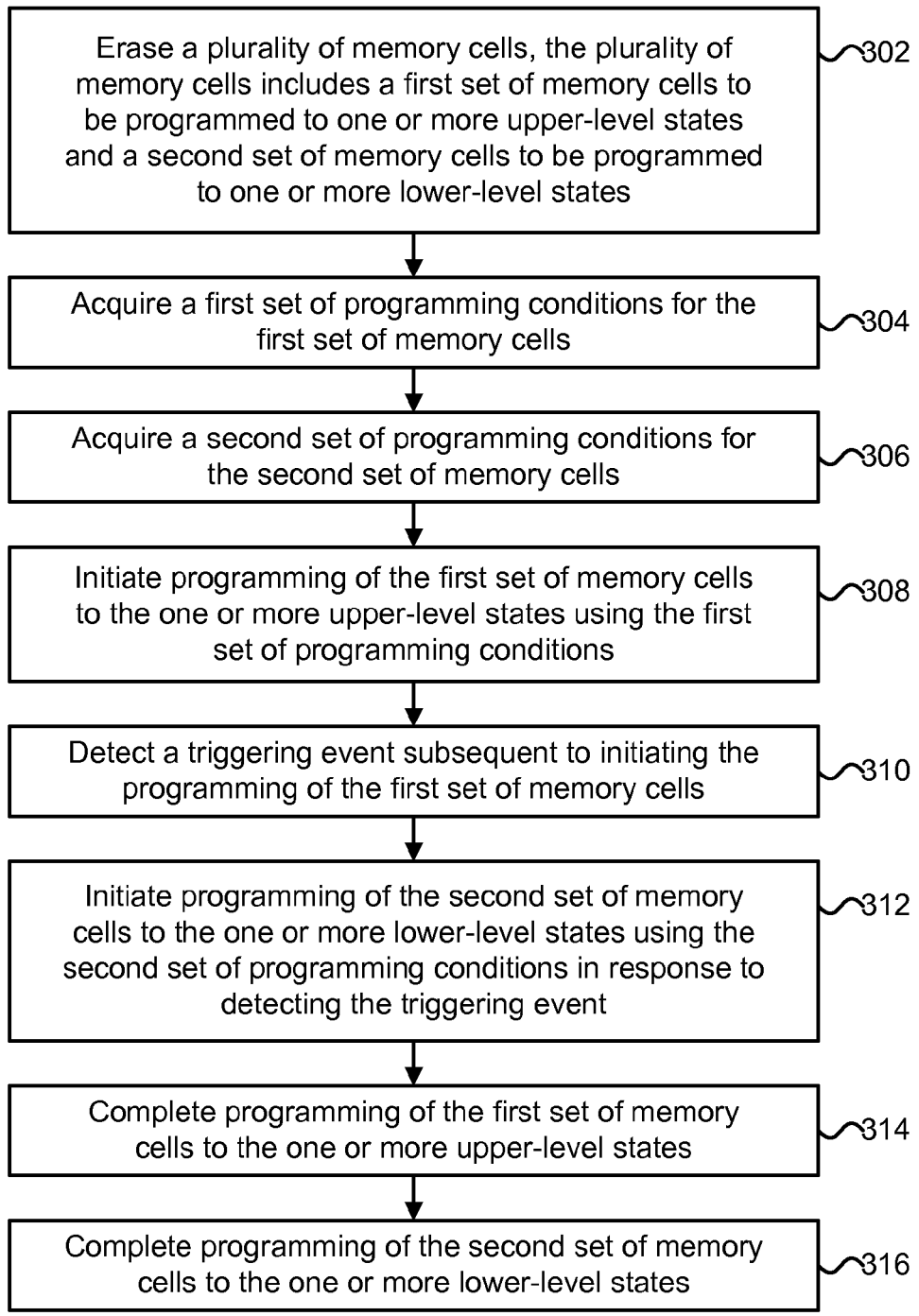
FIG. 12A is a flowchart describing one embodiment of a process for programming non-volatile storage elements.

FIG. 12A is a flowchart describing one embodiment of a process for programming non-volatile storage elements. In one embodiment, the process of FIG. 12A may be performed by a non-volatile storage system, such as non-volatile storage system 596 in FIG. 5.

In step 302, a plurality of memory cells is erased. The plurality of memory cells may include a first set of memory cells to be programmed to one or more upper-level states (e.g., B and C states) and a second set of memory cells to be programmed to one or more lower-level states (e.g., an A state). In some cases, each of the threshold voltage distributions corresponding with the one or more lower-level programming states is less than any of the threshold voltage distributions corresponding with the one or more upper-level programming states.

In step 304, a first set of programming conditions for the first set of memory cells is acquired (e.g., from a non-volatile memory storing memory configuration information). The first set of programming conditions may include a first initial programming voltage (e.g., VPBC of FIG. 11A) and a programming step size corresponding with the application of incremental adjustments to the first initial programming voltage over time. In step 306, a second set of programming conditions for the second set of memory cells is acquired. The second set of programming conditions may include a second initial programming voltage (e.g., VPA of FIG. 11A) and a programming step size corresponding with the application of incremental adjustments to the second initial programming voltage over time. The first initial programming voltage may be greater than the second initial programming voltage. In one embodiment, the A-state programming pulse initial programming voltage and step size may be independently controlled from the BC-state programming pulse initial programming voltage and step size.

In step 308, the programming of the first set of memory cells to the one or more upper level states using the first set of programming conditions is initiated. In step 310, a triggering event is detected subsequent to initiating the programming of the first set of memory cells. In one embodiment, the triggering event may involve detecting that a number of the first set of memory cells has reached or been programmed to a certain triggering verify level (e.g., that 90% of the first set of memory cells have reached the triggering verify level). In another embodiment, the triggering event may involve detecting that a particular number of programming phases have been applied to the first set of memory cells (e.g., after five programming phases have been applied to the first set of memory cells).

In step 312, programming of the second set of memory cells to the one or more lower-level states using the second set of programming conditions is initiated in response to detecting the triggering event. In step 314, programming of the first set of memory cells to the one or more upper-level states is completed. The one or more upper-level states may comprise a B-state and a C-state corresponding with the top two states in a two bit-per-cell MLC NAND. In step 316, programming of the second set of memory cells to the one or more lower-level states is completed. The one or more lower-level states may comprise an A-state corresponding with the second lowest state in a two bit-per-cell MLC NAND. In some cases, the programming of the first set of memory cells to the one or more upper-level programming states using the first set of programming conditions and the second set of memory cells to the one or more lower-level programming states using the second set of programming conditions may be performed during a common programming phase in response to detecting the triggering event.

Figure 12B:
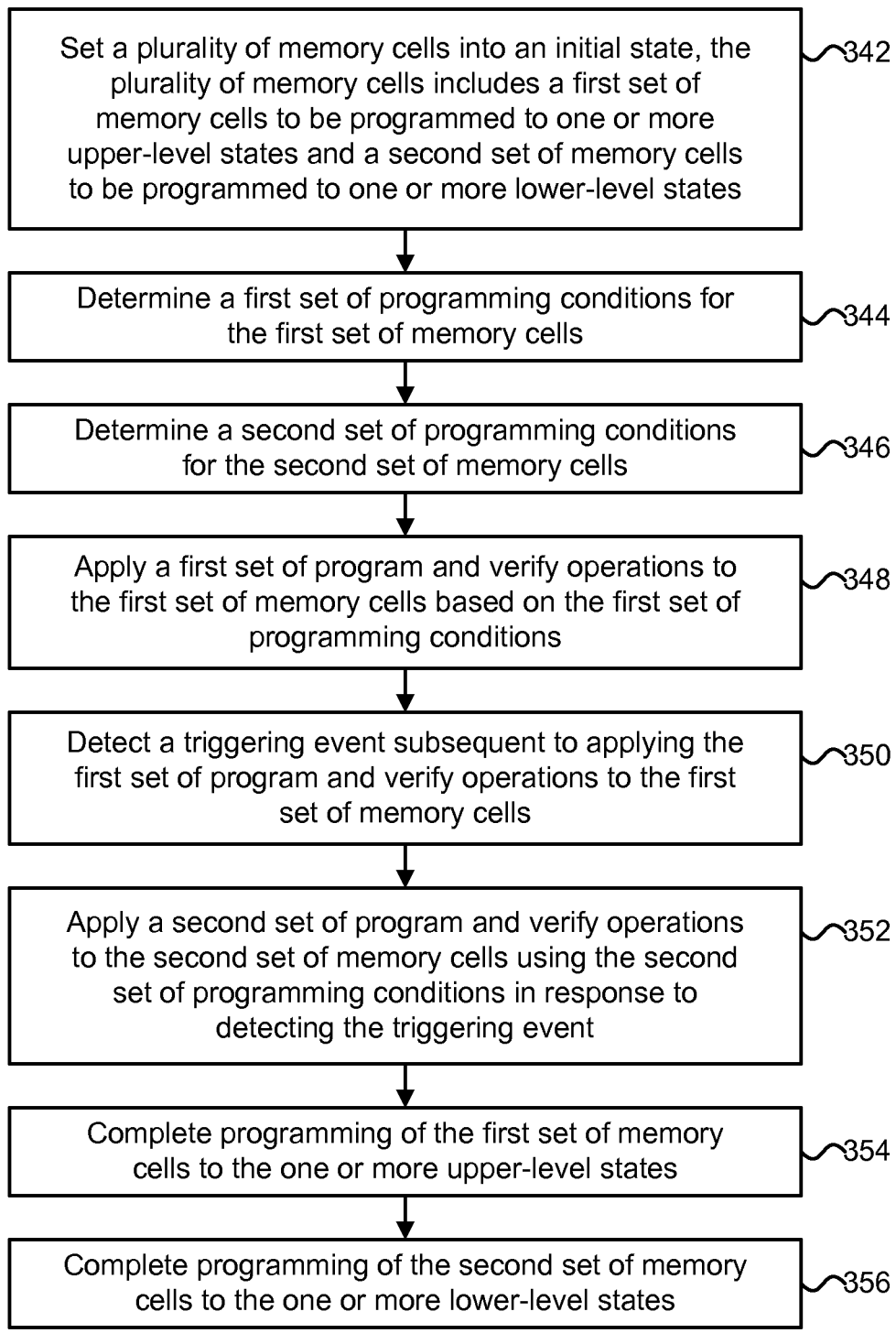
FIG. 12B is a flowchart describing an alternative embodiment of a process for programming non-volatile storage elements.

FIG. 12B is a flowchart describing an alternative embodiment of a process for programming non-volatile storage elements. In one embodiment, the process of FIG. 12B may be performed by a non-volatile storage system, such as non-volatile storage system 596 in FIG. 5.

In step 342, a plurality of memory cells is set into an initial state (e.g., an erased state). The plurality of memory cells includes a first set of memory cells to be programmed to one or more upper-level states and a second set of memory cells to be programmed to one or more lower-level states.

In step 344, a first set of programming conditions is determined for the first set of memory cells. In step 346, a second set of programming conditions is determined for the second set of memory cells. The first set of programming conditions may include a first initial programming voltage (e.g., VPBC of FIG. 11A) and a programming step size (e.g., 50 mV) corresponding with the application of incremental adjustments to the first initial programming voltage over time (or as the number of programming cycles increases). The second set of programming conditions may include a second initial programming voltage (e.g., VPA of FIG. 11A) and a programming step size (e.g., 25 mV or half of the programming step size used for the first set of programming conditions) corresponding with the application of incremental adjustments to the second initial programming voltage over time (or as the number of programming cycles increases). In one embodiment, the first initial programming voltage may be greater than the second initial programming voltage. In another embodiment, the first initial programming voltage may be less than the second initial programming voltage.

In step 348, a first set of program and verify operations is applied to the first set of memory cells based on the first set of programming conditions. In step 350, a triggering event is detected subsequent to applying the first set of program and verify operations to the first set of memory cells. In one embodiment, the triggering event may involve detecting that a number of the first set of memory cells has reached a certain triggering verify level (e.g., that 94% of the first set of memory cells have reached or exceeded the triggering verify level). In another embodiment, the triggering event may involve detecting that a particular number of programming phases have been applied to the first set of memory cells (e.g., after five programming phases have been applied to the first set of memory cells).

In some embodiments, the triggering verify level used for detecting a triggering event may be adjusted over time based on an aging of the non-volatile storage elements or a number of times that the non-volatile storage elements have been programmed and erased. In one example, the triggering verify level may comprise five volts and then after 20 program/erase cycles, the triggering verify level may be increased to seven volts.

In step 352, a second set of program and verify operations is applied to the second set of memory cells using the second set of programming conditions in response to detecting the triggering event. In step 354, programming of the first set of memory cells to the one or more upper-level states is completed. In step 356, programming of the second set of memory cells to the one or more lower-level states is completed. The one or more upper-level states may comprise a B-state and a C-state corresponding with the top two states in a two bit-per-cell Flash memory. The one or more lower-level states may comprise an A-state corresponding with the second lowest state in a two bit-per-cell Flash memory.

One embodiment of the disclosed technology includes acquiring a first set of programming conditions associated with a first set of memory cells to be programmed to one or more upper-level programming states. The first set of memory cells is in communication with a selected word line. The method further comprises acquiring a second set of programming conditions associated with a second set of memory cells to be programmed to one or more lower-level programming states. The second set of memory cells is in communication with the selected word line. The method further comprises initiating programming of the first set of memory cells to the one or more upper-level programming states using the first set of programming conditions, detecting a triggering event subsequent to the initiating programming of the first set of memory cells, and programming the first set of memory cells to the one or more upper-level programming states using the first set of programming conditions and the second set of memory cells to the one or more lower-level programming states using the second set of programming conditions during a common programming phase in response to the detecting a triggering event.

One embodiment of the disclosed technology includes initiating programming of a first set of memory cells to one or more upper-level programming states using a first set of programming conditions. The first set of memory cells is connected to a selected word line. The method further comprises detecting a triggering event subsequent to the initiating programming of the first set of memory cells and initiating programming of a second set of memory cells to one or more lower-level programming states using a second set of programming conditions in response to the detecting a triggering event. The second set of memory cells is connected to the selected word line. The method further comprises completing programming of the first set of memory cells to the one or more upper-level programming states subsequent to the initiating programming of the second set of memory cells and completing programming of the second set of memory cells to the one or more lower-level programming states.

One embodiment of the disclosed technology includes a semiconductor memory array and one or more managing circuits in communication with the semiconductor memory array. The semiconductor memory array includes a first set of memory cells to be programmed to one or more upper-level programming states and a second set of memory cells to be programmed to one or more lower-level programming states less than the one or more upper-level programming states. The first set of memory cells is in communication with a selected word line and the second set of memory cells is in communication with the selected word line. The one or more managing circuits begin programming of the first set of memory cells to the one or more upper-level programming states, detect a triggering event subsequent to beginning programming of the first set of memory cells, and program the first set of memory cells to the one or more upper-level programming states using a first set of programming conditions and the second set of memory cells to the one or more lower-level programming states using a second set of programming conditions during a common programming phase in response to detecting the triggering event. The first set of programming conditions includes a first initial programming voltage and the second set of programming conditions includes a second initial programming voltage less than the first initial programming voltage.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for programming non-volatile storage elements, comprising:

acquiring a first set of programming conditions associated with a first set of memory cells to be programmed to one or more upper-level programming states, the first set of memory cells is in communication with a selected word line;

acquiring a second set of programming conditions associated with a second set of memory cells to be programmed to one or more lower-level programming states, the second set of memory cells is in communication with the selected word line, the first set of programming conditions is different from the second set of programming conditions;

initiating programming of the first set of memory cells to the one or more upper-level programming states using the first set of programming conditions;
detecting a triggering event subsequent to the initiating programming of the first set of memory cells; and
programming the first set of memory cells to the one or more upper-level programming states using the first set of programming conditions and the second set of memory cells to the one or more lower-level programming states using the second set of programming conditions during a common programming phase in response to the detecting a triggering event.

2. The method of claim 1, wherein:
the first set of programming conditions includes a first programming step size and the second set of programming conditions includes a second programming step size less than the first programming step size.

3. The method of claim 1, wherein:
the first set of programming conditions includes a first initial programming voltage and the second set of programming conditions includes a second initial programming voltage less than the first initial programming voltage.

4. The method of claim 1, wherein:
the detecting a triggering event includes detecting that a subset of the first set of memory cells have been programmed to at least a triggering verify level.

5. The method of claim 4, wherein:
the triggering verify level is determined based on a number of times that the first set of memory cells has been programmed and erased.

6. The method of claim 1, wherein:
the detecting a triggering event includes detecting that a particular number of programming cycles have been applied to the first set of memory cells since a last erase of the first set of memory cells.

7. The method of claim 6, wherein:
the particular number of programming cycles is determined based on a number of times that the first set of memory cells has been programmed and erased.

8. The method of claim 1, further comprising:
erasing the first set of memory cells prior to the initiating programming of the first set of memory cells, the first set of memory cells comprises NAND memory cells.

9. A method for writing data to a non-volatile storage system, comprising:
initiating programming of a first set of memory cells to one or more upper-level programming states using a first set of programming conditions, the first set of memory cells is connected to a selected word line;
detecting a triggering event subsequent to the initiating programming of the first set of memory cells;
initiating programming of a second set of memory cells to one or more lower-level programming states using a second set of programming conditions in response to the detecting a triggering event, the second set of memory cells is connected to the selected word line, the first set of programming conditions is different from the second set of programming conditions;
completing programming of the first set of memory cells to the one or more upper-level programming states subsequent to the initiating programming of the second set of memory cells; and
completing programming of the second set of memory cells to the one or more lower-level programming states.

10. The method of claim 9, wherein:
the first set of programming conditions includes a first programming step size and the second set of programming conditions includes a second programming step size less than the first programming step size.

11. The method of claim 9, wherein:
the first set of programming conditions includes a first initial programming voltage and the second set of programming conditions includes a second initial programming voltage less than the first initial programming voltage.

12. The method of claim 9, wherein:
the detecting a triggering event includes detecting that a subset of the first set of memory cells have been programmed to at least a triggering verify level.

13. The method of claim 4, wherein:
the triggering verify level is determined based on a number of times that the first set of memory cells has been programmed and erased.

14. The method of claim 12, wherein:
the initiating programming of a first set of memory cells includes applying a first verify voltage level associated with the triggering verify level to the selected word line.

15. The method of claim 9, wherein:
the detecting a triggering event includes detecting that a particular number of programming cycles have been applied to the first set of memory cells.

16. The method of claim 15, wherein:
the particular number of programming cycles is determined based on a number of times that the first set of memory cells has been programmed and erased.

17. A non-volatile storage system, comprising:
a semiconductor memory array, the semiconductor memory array includes a first set of memory cells to be programmed to one or more upper-level programming states and a second set of memory cells to be programmed to one or more lower-level programming states less than the one or more upper-level programming states, the first set of memory cells is in communication with a selected word line, the second set of memory cells is in communication with the selected word line; and
one or more managing circuits in communication with the semiconductor memory array, the one or more managing circuits begin programming of the first set of memory cells to the one or more upper-level programming states, the one or more managing circuits detect a triggering event subsequent to beginning programming of the first set of memory cells, the one or more managing circuits program the first set of memory cells to the one or more upper-level programming states using a first set of programming conditions and the second set of memory cells to the one or more lower-level programming states using a second set of programming conditions during a common programming phase in response to detecting the triggering event, the first set of programming conditions includes a first initial programming voltage and the second set of programming conditions includes a second initial programming voltage less than the first initial programming voltage.

18. The non-volatile storage system of claim 17, wherein:
the one or more managing circuits detect the triggering event by detecting that a subset of the first set of memory cells have been programmed to at least a triggering verify level.

19. The non-volatile storage system of claim 18, wherein:
the one or more managing circuits determine the triggering verify level based on a number of times that the first set of memory cells has been programmed and erased.

20. The non-volatile storage system of claim 17, wherein:
the one or more managing circuits detect the triggering event by detecting that a particular number of programming cycles have been applied to the first set of memory cells, the particular number of programming cycles is determined based on a number of times that the first set of memory cells has been programmed and erased.

* * * * *